(12) United States Patent  
Park

(10) Patent No.: US 12,548,834 B2  
(45) Date of Patent: Feb. 10, 2026

(54) BATTERY PACK

(71) Applicant: Samsung SDI Co., Ltd., Yongin-si (KR)

(72) Inventor: Sanghun Park, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 395 days.

(21) Appl. No.: 17/133,881

(22) Filed: Dec. 24, 2020

(65) Prior Publication Data

US 2021/0203030 A1  Jul. 1, 2021

(30) Foreign Application Priority Data

Dec. 31, 2019  (KR) .......................... 10-2019-0179793

(51) Int. Cl.  
*H01M 50/216* (2021.01)  
*H01M 10/42* (2006.01)  
(Continued)

(52) U.S. Cl.  
CPC ....... *H01M 50/216* (2021.01); *H01M 10/425* (2013.01); *H01M 50/50* (2021.01);  
(Continued)

(58) Field of Classification Search  
CPC ..... H01M 10/4207; H01M 50/20–216; H01M 50/502; H01M 50/519;  
(Continued)

(56) References Cited

U.S. PATENT DOCUMENTS 5,993,248 A    11/1999 Bethurum  
6,580,035 B1 * 6/2003 Chung ................... H05K 3/321  
                                                    174/254  
(Continued)

FOREIGN PATENT DOCUMENTS

CN          1507670 A      6/2004  
CN        201528000 U      7/2010  
(Continued)

OTHER PUBLICATIONS

Yin, L., Seo, J. K., Kurniawan, J., Kumar, R., Lv, J., Xie, L., Liu, X., Xu, S., Meng, Y. S., Wang, J., "Highly Stable Battery Pack via Insulated, Reinforced, Buckling-Enabled Interconnect Array" Small Journal 2018, vol. 14, Iss 43. https://doi.org/10.1002/smll.201800938 (Year: 2018).*

(Continued)

*Primary Examiner* — Allison Bourke  
*Assistant Examiner* — Bethany C Garcia  
(74) *Attorney, Agent, or Firm* — Womble Bond Dickinson (US) LLP

(57) ABSTRACT

A battery pack includes: a battery cell including a first surface and a second surface which are opposite each other and on which first and second electrodes are respectively formed, and a lateral surface connecting the first and second surfaces to each other; a first circuit board arranged on the first surface and connected to the first electrode; a second circuit board arranged on the second surface and connected to the second electrode; and a flexible wiring crossing the lateral surface of the battery cell and electrically connecting the first and second circuit boards to each other, and the first circuit board includes: a first compressible conductor on an inner surface of the first circuit board, the inner surface facing the first electrode; and a first pressing surface and a (Continued)

first mounting portion on an outer surface of the first circuit board.

20 Claims, 7 Drawing Sheets

(51) Int. Cl.
*H01M 50/50* (2021.01)
*H01M 50/519* (2021.01)
*H05K 1/14* (2006.01)
*H05K 1/18* (2006.01)
*H05K 3/32* (2006.01)

(52) U.S. Cl.
CPC .......... *H01M 50/519* (2021.01); *H05K 1/148* (2013.01); *H05K 1/181* (2013.01); *H05K 1/189* (2013.01); *H05K 3/323* (2013.01); *H05K 3/326* (2013.01)

(58) Field of Classification Search
CPC ..... H01M 50/522–574; H01M 50/284; H01M 50/503; H01M 50/591; H01M 50/593; H01M 50/595; H01M 10/643; H01M 10/46; H01M 10/4257; H01M 10/425; H01M 10/482; H01M 10/486; H01M 10/48; H01M 2200/00; H01M 2200/20; H05K 1/145–148; H05K 1/181–189; H05K 3/321–326; H05K 2203/0278; H05K 3/305; H05K 3/32–323; H05K 1/14; H05K 1/165; H05K 2201/10037; H05K 2201/042; H05K 2201/056; H05K 2201/09027; H05K 2201/0278; H05K 3/341; H05K 1/18; H05K 1/89; H05K 1/16; Y02E 60/10; Y02P 70/50; Y10T 29/49114; Y10T 29/49826; H01R 12/52; H01R 12/77; H01R 12/65; H01R 12/515; H01R 2201/0195; H01R 2201/01; H01R 2201/10189
See application file for complete search history.

(56) References Cited

U.S. PATENT DOCUMENTS

| | | | |
|---|---|---|---|
| 9,147,864 B2 | 9/2015 | Jang et al. | |
| 2004/0115519 A1* | 6/2004 | Lee | H01M 50/502 429/61 |
| 2009/0148757 A1* | 6/2009 | Zhang | H01M 50/559 429/100 |
| 2009/0263711 A1 | 10/2009 | Kim et al. | |
| 2010/0136374 A1* | 6/2010 | Jang | H01M 10/425 429/174 |
| 2012/0190252 A1* | 7/2012 | Pavlinsky | H01M 10/425 439/775 |
| 2014/0220419 A1 | 8/2014 | Yoshioka et al. | |
| 2017/0207433 A1 | 7/2017 | Hong et al. | |
| 2017/0373207 A1 | 12/2017 | Hwang et al. | |

FOREIGN PATENT DOCUMENTS

| | | |
|---|---|---|
| CN | 103891005 A | 6/2014 |
| CN | 204596965 U | 8/2015 |
| JP | 1994-058796 B2 | 8/1994 |
| JP | 4632654 B2 | 11/2010 |
| JP | 2012142170 A * | 7/2012 |
| KR | 10-0284962 B1 | 5/2001 |
| KR | 10-2003-0087981 | 11/2003 |
| KR | 10-2010-0062745 | 6/2010 |
| KR | 10-2012-0103394 | 9/2012 |
| KR | 10-2016-0016597 | 2/2016 |
| KR | 10-2018-0005959 | 1/2018 |

OTHER PUBLICATIONS

JP-2012142170-A—English with Paragraph Numbering (Year: 2024).*
Extended European Search Report from corresponding European Patent Application No. 20217625.1, European Search Report mailed Apr. 23, 2021 (8 pgs.).
CN Office action dated Oct. 9, 2022 issued in corresponding CN Patent Application No. 202011605590.2, 8 pages.
KR Office action dated Sep. 21, 2022 issued in corresponding KR Patent Application No. 10-2019-0179793, 4 pages.
Chinese Office action for Application No. 202011605590.2, issued Jun. 3, 2023, 16 pages.
Office action issued by the Chinese Patent Office for Application No. 202011605590.2, mailed Nov. 20, 2023, 5 pages, with English translation, 9 pages.
Office action issued by the European Patent Office for Application No. 20217625.1, issued Oct. 20, 2023, 5 pages.
Office action issued by the EPO on Mar. 14, 2025 for corresponding EP Patent Application No. 20217625.1, 5 pages.

* cited by examiner

BATTERY PACK

CROSS-REFERENCE TO RELATED APPLICATION

This application claims priority to and the benefit of Korean Patent Application No. 10-2019-0179793, filed on Dec. 31, 2019 in the Korean Intellectual Property Office, the entire disclosure of which is incorporated herein by reference.

BACKGROUND

1. Field

Aspects of one or more embodiments relate to a battery pack.

2. Description of the Related Art

In general, secondary batteries refer to batteries that can be repeatedly charged and recharged, unlike non-rechargeable primary batteries. Secondary batteries are used as energy sources of devices, such as mobile devices, electric vehicles, hybrid vehicles, electric bicycles, or uninterruptible power supplies. Secondary batteries are individually used or secondary battery modules or packs, each including a plurality of secondary batteries connected as one unit, are used according to the types of external devices using secondary batteries.

Unlike small mobile devices, such as cellular phones, each operable for a certain period of time using a single battery, devices, such as electric vehicles or hybrid vehicles, having long operation times and consuming large amounts of electricity may use battery modules each including a plurality of batteries to handle issues relating to power and capacity, and the output voltages or currents of battery modules may be increased by adjusting the number of batteries included in each battery module.

SUMMARY

According to an aspect of one or more embodiments, a battery pack having a relatively low height and a slim structure is provided.

According to another aspect of one or more embodiments, a compact battery pack having a simple electrical connection structure for forming a charge-discharge path of a battery cell is provided.

Additional aspects will be set forth, in part, in the description which follows and, in part, will be apparent from the description, or may be learned by practice of the presented embodiments of the disclosure.

According to one or more embodiments, a battery pack includes: a battery cell including a first surface and a second surface which are opposite each other and on which first and second electrodes are respectively formed, and a lateral surface connecting the first and second surfaces to each other; a first circuit board arranged on the first surface and connected to the first electrode; a second circuit board arranged on the second surface and connected to the second electrode; and a flexible wiring crossing the lateral surface of the battery cell and electrically connecting the first and second circuit boards to each other, and the first circuit board includes: a first compressible conductor on an inner surface of the first circuit board, the inner surface facing the first electrode; and a first pressing surface and a first mounting portion on an outer surface of the first circuit board.

In one or more embodiments, the first pressing surface may be at a position corresponding to the first compressible conductor.

In one or more embodiments, the first compressible conductor may be at a center area of the inner surface of the first circuit board, the first pressing surface may be at a center area of the outer surface of the first circuit board, and the first mounting portion may be at a peripheral area of the outer surface of the first circuit board, the peripheral area surrounding the center area of the outer surface of the first circuit board.

In one or more embodiments, the first pressing surface may be defined by a flat portion of the outer surface of the first circuit board, the flat portion being exposed in a direction opposite the first electrode.

In one or more embodiments, the first compressible conductor may include an anisotropic conductive adhesive.

In one or more embodiments, the first mounting portion may include at least one circuit element mounted on the outer surface of the first circuit board.

In one or more embodiments, a first insulating adhesive layer may be arranged on the inner surface of the first circuit board and may surround the first compressible conductor.

In one or more embodiments, the first compressible conductor may be at a center area of the inner surface of the first circuit board, and the first insulating adhesive layer may be at a peripheral area of the inner surface of the first circuit board, the peripheral area surrounding the center area of the inner surface of the first circuit board.

In one or more embodiments, the first insulating adhesive layer may include a double-sided tape.

In one or more embodiments, the second circuit board may include: a second compressible conductor on an inner surface of the second circuit board, the inner surface facing the second electrode; and a second mounting portion on an outer surface of the second circuit board, the outer surface of the second circuit board being opposite the second electrode.

In one or more embodiments, the second compressible conductor may include an anisotropic conductive adhesive.

In one or more embodiments, the second circuit board may further include a second pressing surface surrounded by the second mounting portion.

In one or more embodiments, the second pressing surface may be at a position corresponding to the second compressible conductor.

In one or more embodiments, the second compressible conductor may be at a center area of the inner surface of the second circuit board, the second pressing surface may be at a center area of the outer surface of the second circuit board, and the second mounting portion may be at a peripheral area of the outer surface of the second circuit board, the peripheral area surrounding the center area of the outer surface of the second circuit board.

In one or more embodiments, the second pressing surface may be defined by a flat portion of the outer surface of the second circuit board, the flat portion being exposed in a direction opposite the second electrode.

In one or more embodiments, the second compressible conductor may include a contact-type elastic part.

In one or more embodiments, the second mounting portion may include at least one circuit element mounted on the outer surface of the second circuit board at a position corresponding to the second compressible conductor.

In one or more embodiments, a second insulating adhesive layer may be arranged on the inner surface of the second circuit board and may surround the second compressible conductor.

In one or more embodiments, the second compressible conductor may be at a center area of the inner surface of the second circuit board, and the second insulating adhesive layer may be at a peripheral area of the inner surface of the second circuit board, the peripheral area surrounding the center area of the inner surface of the second circuit board.

In one or more embodiments, the second insulating adhesive layer may include a double-sided tape.

BRIEF DESCRIPTION OF THE DRAWINGS

The above and other aspects, features, and advantages of embodiments of the disclosure will be more apparent from the following description of some example embodiments taken in conjunction with the accompanying drawings, in which.

DETAILED DESCRIPTION

Figure 1:
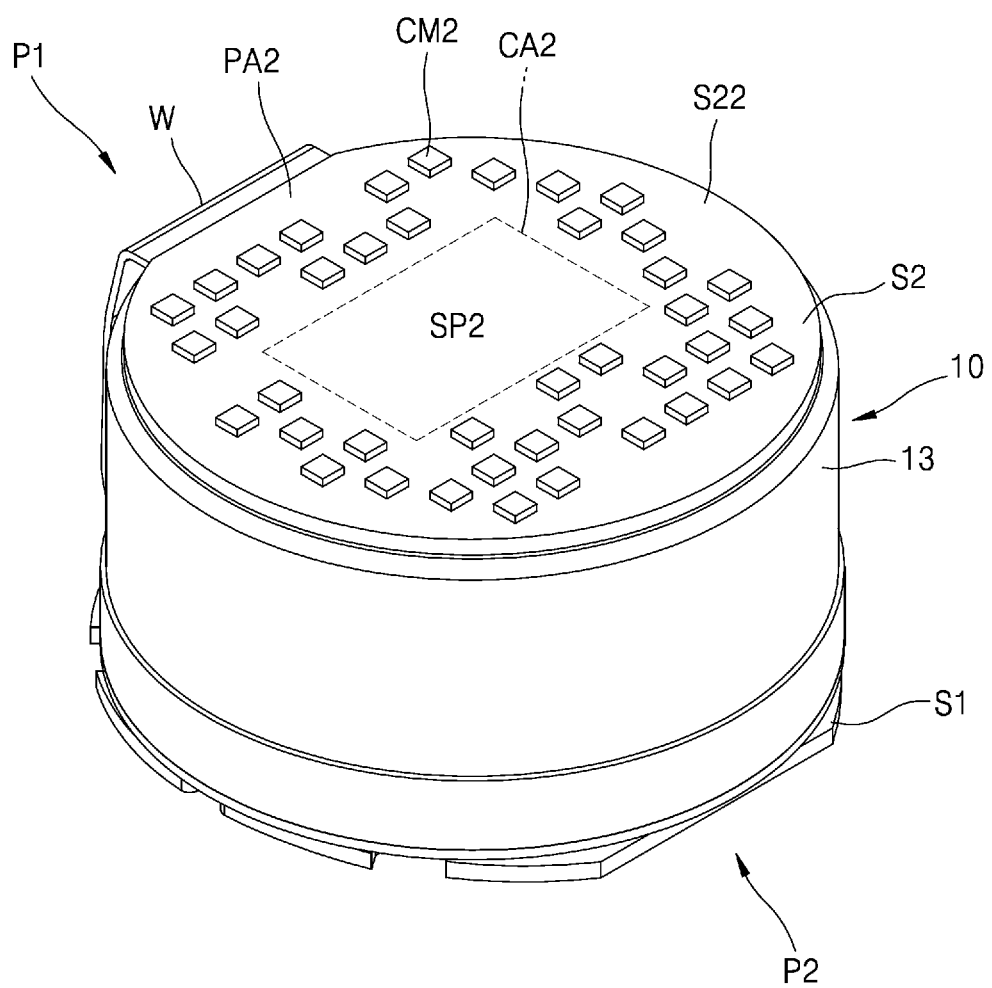
FIG. 1 is a perspective view illustrating a battery pack according to an embodiment.

Reference will now be made in further detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present disclosure. As used herein, the term "and/or" includes any and all combinations of one or more of the associated listed items. Expressions such as "at least one of," when preceding a list of elements, modify the entire list of elements and do not modify the individual elements of the list.

As used herein, the singular forms "a," "an," and "the" are intended to include the plural forms as well, unless the context clearly indicates otherwise.

It is to be understood that the terms "comprise," "include," and "have" used herein specify the presence of stated features or components, but do not preclude the presence or addition of one or more other features or components.

Sizes of components in the drawings may be exaggerated for convenience of description. In other words, since the sizes and thicknesses of components in the drawings may be arbitrarily illustrated for convenience of description, the following embodiments are not limited thereto.

It is to be understood that when a layer, region, or component is referred to as being "connected to" another layer, region, or component, it may be directly connected to the other layer, region, or component or may be indirectly connected to the other layer, region, or component with one or more intervening layers, regions, or components interposed therebetween. For example, it is to be understood that when a layer, region, or component is referred to as being "electrically connected to" another layer, region, or component, it may be directly electrically connected to the other layer, region, or component or may be indirectly electrically connected to the other layer, region, or component with one or more intervening layers, regions, or components interposed therebetween.

Spatially relative terms, such as "beneath," "below," "lower," "above," "upper," and the like, may be used herein for ease of description to describe one element or feature's relationship to another element(s) or feature(s) as illustrated in the figures. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

A battery pack according to some example embodiments is described below with reference to the accompanying drawings.

Figure 2:
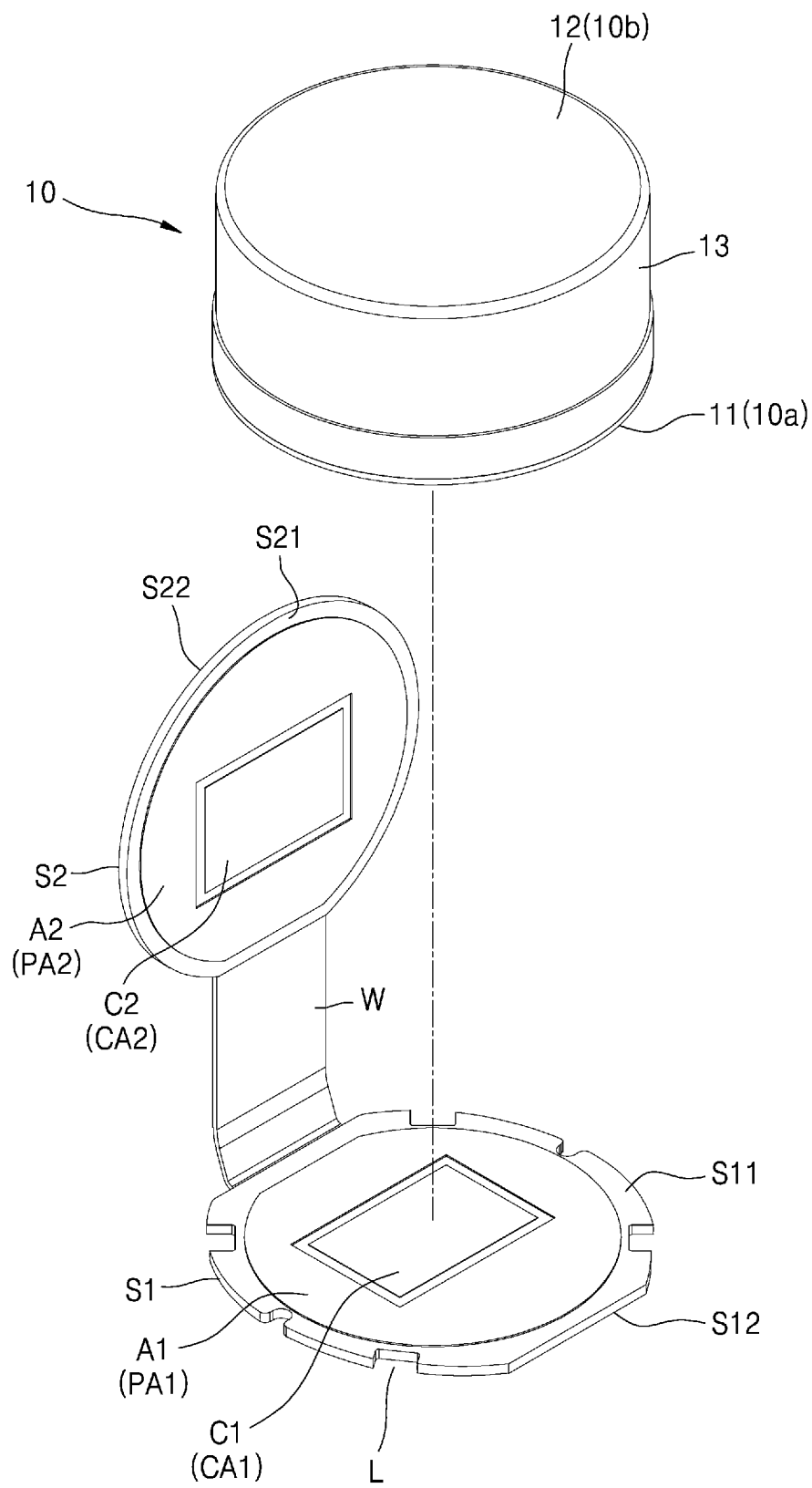
FIG. 2 is an exploded perspective view illustrating the battery pack shown in FIG. 1.
Figure 3:
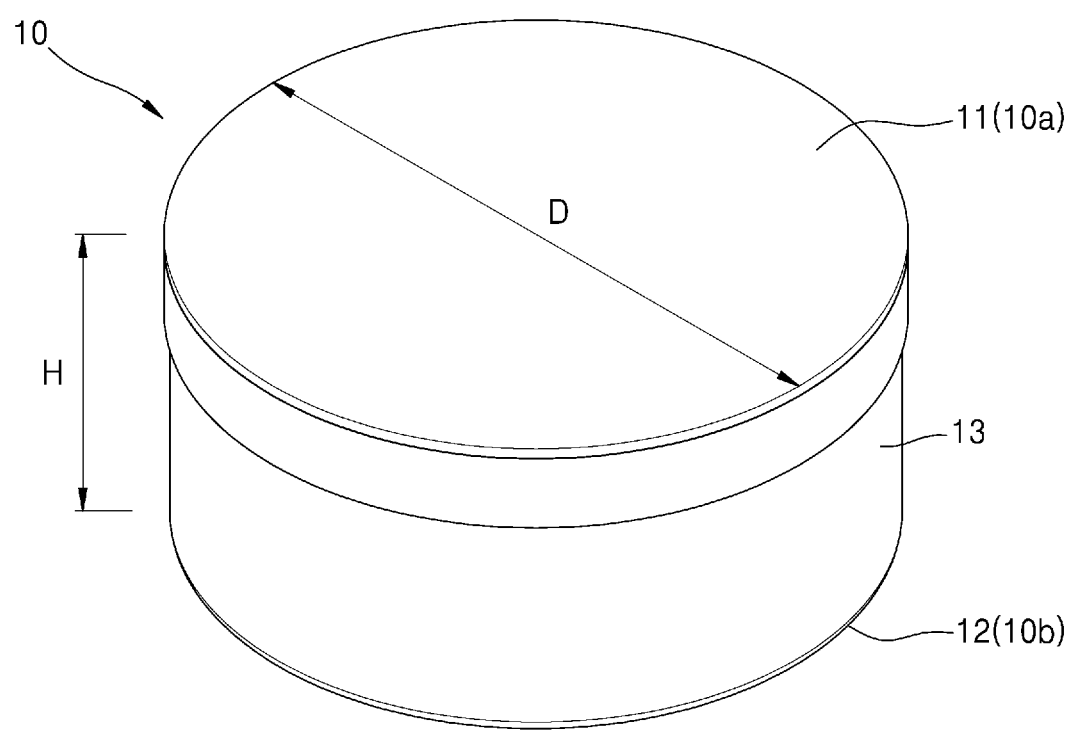
FIG. 3 is a perspective view illustrating a battery cell shown in FIG. 1.
Figure 4A:
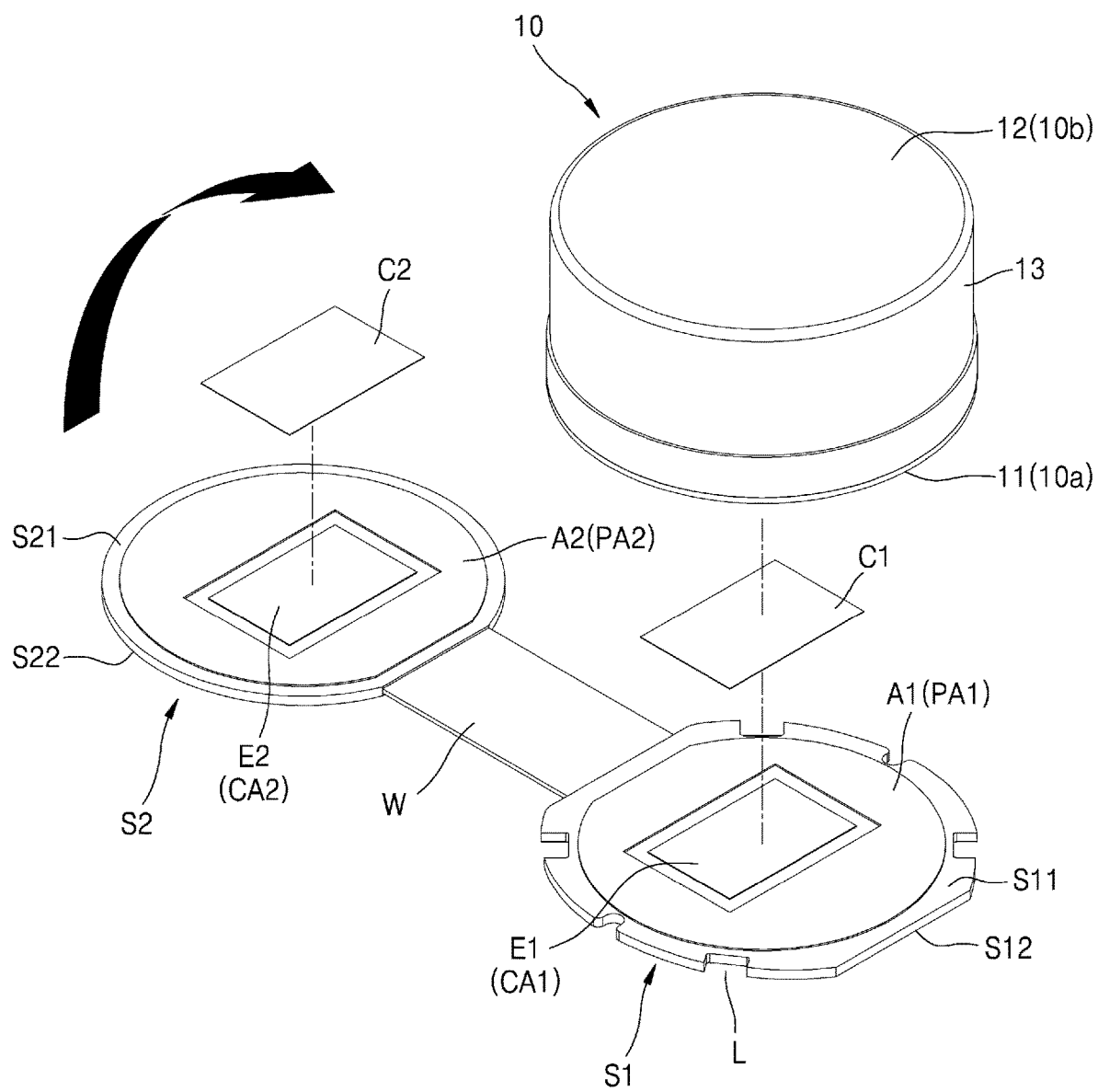
FIGS. 4A and 4B are perspective views illustrating a circuit package that is shown in FIG. 1 and includes first and second circuit boards and flexible wiring connecting the first and second circuit boards to each other, the perspective views respectively showing inner surfaces and outer surfaces of the first and second circuit boards.
Figure 4B:
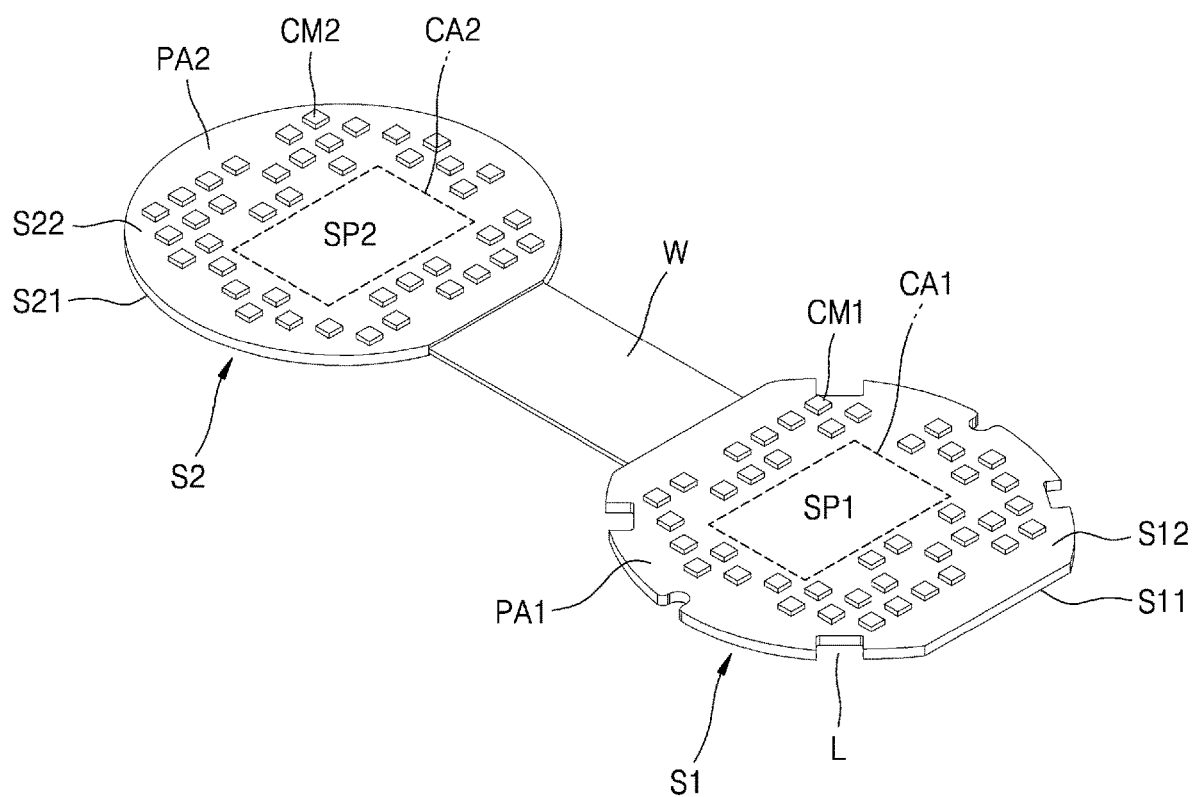

FIG. 1 is a perspective view illustrating a battery pack according to an embodiment; FIG. 2 is an exploded perspective view illustrating the battery pack shown in FIG. 1; FIG. 3 is a perspective view illustrating a battery cell shown in FIG. 1; and FIGS. 4A and 4B are perspective views illustrating a circuit package that is shown in FIG. 1 and includes first and second circuit boards S1 and S2 and flexible wiring W connecting the first and second circuit boards S1 and S2 to each other, the perspective views respectively showing inner surfaces S11 and S21 and outer surfaces S12 and S22 of the first and second circuit boards S1 and S2.

Referring to FIGS. 1 to 4B, a battery pack according to an embodiment includes: a battery cell 10 which includes first and second surfaces 11 and 12 on which first and second electrodes 10a and 10b are respectively formed, and a lateral surface 13 connecting the first and second surfaces 11 and 12 to each other; the first circuit board S1 arranged on the first surface 11 and connected to the first electrode 10a; the second circuit board S2 arranged on the second surface 12 and connected to the second electrode 10b; and the flexible wiring W arranged across the lateral surface 13 and electrically connecting the first and second circuit boards S1 and S2 to each other, and the first circuit board S1 may include a first compressible conductor C1 provided on the inner surface S11 facing the first electrode 10a, a first pressing surface SP1 formed on the outer surface S12 which is opposite the first electrode 10a, and a first mounting portion CM1 surrounding at least a portion of the first pressing surface SP1.

The battery cell 10 may include: the first and second surfaces 11 and 12 which are opposite each other; and the lateral surface 13 which connects the first and second surfaces 11 and 12 to each other. For example, according to an embodiment, the first and second surfaces 11 and 12 may have a circular shape, and the lateral surface 13 may be rounded like a circumferential surface and connects the first and second surfaces 11 and 12 to each other.

As described later, the first and second circuit boards S1 and S2 arranged on the first and second surfaces 11 and 12 of the battery cell 10 may include round circumferential surfaces corresponding to the battery cell 10. In this case, the expression that the first and second circuit boards S1 and S2 include round circumferential surfaces may mean that the circumferential surfaces are formed along at least portions of the edges of the first and second circuit boards S1 and S2 but may not necessarily mean that the circumferential surfaces are formed entirely along the edges of the first and second circuit boards S1 and S2. In an embodiment, alignment notches L for alignment with an external device (not shown) may be formed at one or more positions along the edge of at least one of the first and second circuit boards S1 and S2, for example, the first circuit board S1.

In this manner, the first and second circuit boards S1 and S2 arranged on the first and second surfaces 11 and 12 of the battery cell 10 may have round circumferential surfaces corresponding to the battery cell 10 and have shapes corresponding to the battery cell 10 in the circumferential direction of the battery cell 10, such that each of the first and second circuit boards S1 and S2 may not form an additional volume protruding from the battery cell 10 and may not have a side protruding in a certain direction from the circumference of the battery cell 10, considering the limited space of a small device in which the battery pack may be installed.

For example, according to an embodiment, the battery cell 10 may be formed in a slim cylindrical shape, such that the battery cell 10 may have a height H which is less than the diameter D of the first surface 11 having a circular shape. In an embodiment, for example, the aspect ratio, that is, the ratio of the height H to the diameter D of the battery cell 10 may be in a range from about 5.4:12 to about 5.4:14.

The first and second electrodes 10a and 10b having opposite polarities may be formed on the first and second surfaces 11 and 12 of the battery cell 10. In an embodiment, the first electrode 10a may be formed on the entirety of the first surface 11 of the battery cell 10, and the second electrode 10b may be formed on the entirety of the second surface 12 of the battery cell 10. In an embodiment, for example, the first electrode 10a may be formed on the entirety of the first surface 11 of the battery cell 10 and a portion of the lateral surface 13 of the battery cell 10, and the second electrode 10b may be formed on the entirety of the second surface 12 of the battery cell 10 and another portion of the lateral surface 13 of the battery cell 10. On the lateral surface 13 of the battery cell 10, the first and second electrodes 10a and 10b may be formed separately or spaced apart from each other and electrically insulated from each other.

In another embodiment, the first electrode 10a may be formed in a center area of the first surface 11, and the second electrode 10b may be formed on the entirety of the second surface 12 and the lateral surface 13 and may extend from the lateral surface 13 to a peripheral area of the first surface 11 which surrounds the first electrode 10a. In this case, the first and second electrodes 10a and 10b may be formed at different positions on the first surface 11, and, for example, the first and second electrodes 10a and 10b may be respectively formed in the center area and the peripheral area of the first surface 11 in a state in which the first and second electrodes 10a and 10b are separate or spaced apart from each other for electrical insulation from each other.

Throughout the present specification, the expression that the first and second electrodes 10a and 10b are formed on the first and second surfaces 11 and 12 of the battery cell 10 may include a structure in which the first and second electrodes 10a and 10b are respectively over the first and second surfaces 11 and 12 of the battery cell 10, or a structure in which the first and second electrodes 10a and 10b are respectively formed at center areas of the first and second surfaces 11 and 12. As described later, the first and second electrodes 10a and 10b of the battery cell 10 may be respectively and electrically connected to the first and second circuit boards S1 and S2 arranged on the first and second surfaces 11 and 12.

The first electrode 10a of the battery cell 10 may be connected to the first circuit board S1. For example, the battery cell 10 may be arranged on the first circuit board S1 in a state in which the first surface 11 on which the first electrode 10a is formed faces the first circuit board S1. For example, the battery cell 10 shown in FIG. 3 may be turned upside down such that the first surface 11 on the upper side and the second surface 12 on the lower side may be inverted, and then the battery cell 10 may be placed on the first circuit board S1 such that the first electrode 10a formed on the first surface 11 of the battery cell 10 may be electrically connected to the first circuit board S1. In other words, the first circuit board S1 may be arranged on the first surface 11 of the battery cell 10.

The first compressible conductor C1 may be arranged between the first circuit board S1 and the first electrode 10a of the battery cell 10 as a medium for conductive connection between the first circuit board S1 and the first electrode 10a. For example, in an embodiment, the first compressible conductor C1 may include an anisotropic conductive adhesive such as an anisotropic conductive film (ACF). When the first electrode 10a and the first circuit board S1 are pressed in mutually-facing directions, the anisotropic conductive adhesive provided as the first compressible conductor C1 may be compressed between the first electrode 10a and the first circuit board S1, and, thus, conductive particles (not shown) dispersed in an insulating base material (not shown) of the anisotropic conductive adhesive may be connected to each other, such that the anisotropic conductive adhesive may have conductivity for electrically connecting the first electrode 10a and the first circuit board S1 to each other.

The first compressible conductor C1 may be provided on the inner surface S11 of the first circuit board S1 which faces the first electrode 10a. In an embodiment, together with the first compressible conductor C1, a first insulating adhesive layer A1 may be arranged on the inner surface S11 of the first circuit board S1 to surround the first compressible conductor C1. In an embodiment, the first compressible conductor C1 may be provided at a center area CA1 of the inner surface S11 of the first circuit board S1, and the first insulating adhesive layer A1 may be provided in a peripheral area PA1 surrounding the center area CA1 of the inner surface S11 of the first circuit board S1. Here, the inner surface S11 of the first circuit board S1 may refer to a surface of the first circuit board S1 which faces the first surface 11 of the battery cell 10 or the first electrode 10a of the battery cell 10, and the outer surface S12 of the first circuit board S1 may refer to the other surface of the first circuit board S1 which is opposite the first surface 11 of the battery cell 10 or the first electrode 10a of the battery cell 10.

In an embodiment, a first electrode pad E1 may be provided in the center area CA1 of the inner surface S11 of the first circuit board S1 for electrical connection with the first electrode 10a of the battery cell 10, and a conductive pattern (not shown) may be provided in the peripheral area PA1 of the inner surface S11 of the first circuit board S1 for transmission of charge-discharge current or different electrical signals. In this case, the center area CA1 of the inner surface S11 of the first circuit board S1 may refer to a position at which the first electrode pad E1 for electrical connection with the first electrode 10a of the battery cell 10 or the first compressible conductor C1 electrically connected to the first electrode pad E1 is provided on the inner surface S11 of the first circuit board S1, and the peripheral area PA1 of the inner surface S11 of the first circuit board S1 may refer to a position around the first electrode pad E1 formed in the center area CA1 of the inner surface S11 of the first circuit board S1 or the first compressible conductor C1 electrically connected to the first electrode pad E1. However, in another embodiment, the center area CA1 and the peripheral area PA1 of the inner surface S11 of the first circuit board S1 may respectively refer to a center position including the center of the first circuit board S1 having an approximately circular shape and a peripheral position around the center position, independently of the first electrode pad E1 formed on the first circuit board S1 or the first compressible conductor C1 electrically connected to the first electrode pad E1. As described later, in the center area CA1 of the inner surface S11 of the first circuit board S1, the first surface 11 (or the first electrode 10a) of the battery cell 10 and the first circuit board S1 (for example, the first electrode pad E1 of the first circuit board S1) may be conductively coupled to each other with the first compressible conductor C1 therebetween, and, in the peripheral area PA1 of the inner surface S11 of the first circuit board S1, the first surface 11 (or the first electrode 10a) of the battery cell 10 and the first circuit board S1 (for example, the conductive pattern of the first circuit board S1) may be insulatively coupled to each other with the first insulating adhesive layer A1 therebetween.

As described above, the center area CA1 and the peripheral area PA1 may be formed on the inner surface S11 of the first circuit board S1, and, similarly, a center area CA1 and a peripheral area PA1 may also be formed on the outer surface S12 of the first circuit board S1. In this case, the center areas CA1 formed on the inner and outer surfaces S11 and S12 of the first circuit board S1 may be at positions corresponding to each other, and, similarly, the peripheral areas PA1 formed on the inner and outer surfaces S11 and S12 of the first circuit board S1 may be at positions corresponding to each other. In the drawings, for ease of understanding, the center areas CA1 and the peripheral areas PA1 formed on the inner and outer surfaces S11 and S12 of the first circuit board S1 are denoted with the same reference numerals.

In an embodiment, the center area CA1 of the outer surface S12 of the first circuit board S1 may refer to a position on the outer surface S12 of the first circuit board S1 which is opposite the inner surface S11 of the first circuit board S1 on which the first electrode pad E1 for electrical connection with the first electrode 10a of the battery cell 10 is provided or the first compressible conductor C1 electrically connected to the first electrode pad E1 is provided. In addition, the peripheral area PA1 of the outer surface S12 of the first circuit board S1 may refer to a position on the outer surface S12 of the first circuit board S1 which is opposite the inner surface S11 of the first circuit board S1 surrounding the first electrode pad E1 or the first compressible conductor C1 electrically connected to the first electrode pad E1. However, in another embodiment, the center area CA1 and the peripheral area PA1 of the outer surface S12 of the first circuit board S1 may respectively refer to a center position including the center of the first circuit board S1 having an approximately circular shape and a peripheral position around the center position, independently of the first electrode pad E1 formed on the first circuit board S1 or the first compressible conductor C1 electrically connected to the first electrode pad E1. Even in this case, the center areas CA1 formed on the inner and outer surfaces S11 and S12 of the first circuit board S1 may be at positions corresponding to each other, and, similarly, the peripheral areas PA1 formed on the inner and outer surfaces S11 and S12 of the first circuit board S1 may be at positions corresponding to each other.

The first insulating adhesive layer A1 may be arranged between the first circuit board S1 and the first surface 11 (or the first electrode 10a) of the battery cell 10 and may insulatively couple the first circuit board S1 and the first surface 11 of the battery cell 10 to each other. For example, the first insulating adhesive layer A1 may insulatively couple the first circuit board S1 (for example, the peripheral area PA1 of the first circuit board S1) and the first surface 11 (for example, the first electrode 10a) of the battery cell 10 such that the first circuit board S1 and the first surface 11 (or the first electrode 10a) of the battery cell 10 may be physically coupled to each other while being electrically insulated from each other for preventing or substantially preventing electrical interference therebetween.

Similarly to the first compressible conductor C1 arranged between the first circuit board S1 and the first surface 11 of the battery cell 10 together with the first insulating adhesive layer A1, the first insulating adhesive layer A1 may be compressed when the first circuit board S1 and the first surface 11 of the battery cell 10 are pressed in mutually-facing directions. In this case, the first compressible conductor C1 formed at the center area CA1 of the inner surface S11 of the first circuit board S1 may be conductively coupled to the first surface 11 (or the first electrode 10a) of the battery cell 10, and the first insulating adhesive layer A1 formed in the peripheral area PA1 of the first circuit board S1 may be insulatively coupled to the first surface 11 (or the first electrode 10a) of the battery cell 10. In an embodiment, the first insulating adhesive layer A1 may include a double-sided tape which has adhesive layers on both sides thereof.

As described above, the first compressible conductor C1 and the first insulating adhesive layer A1 surrounding the first compressible conductor C1 may be provided on the inner surface S11 of the first circuit board S1, and the first pressing surface SP1 and the first mounting portion CM1 surrounding at least a portion of the first pressing surface SP1 may be provided on the outer surface S12 of the first circuit board S1. Here, the inner surface S11 and the outer surface S12 of the first circuit board S1 may respectively refer to a side of the first circuit board S1 which faces the first electrode 10a of the battery cell 10 and the other side of the first circuit board S1 which is opposite the first electrode 10a of the battery cell 10.

The inner surface S11 and the outer surface S12 of the first circuit board S1 may have structures corresponding to each other, and the first compressible conductor C1 and the first pressing surface SP1 may be provided at corresponding positions on the inner and outer surfaces S11 and S12 of the first circuit board S1, respectively. For example, the first compressible conductor C1 and the first pressing surface SP1 may be provided in the center areas CA1 of the inner and outer surfaces S11 and S12 of the first circuit board S1. In addition, the first insulating adhesive layer A1 and the first mounting portion CM1 respectively provided on the inner and outer surfaces S11 and S12 of the first circuit board S1 may be at positions corresponding to each other. For example, the first insulating adhesive layer A1 and the first mounting portion CM1 may be provided in the peripheral areas PA1 surrounding the center areas CA1 of the inner and outer surfaces S11 and S12 of the first circuit board S1.

The first pressing surface SP1 may be formed by the outer surface S12 of the first circuit board S1 which is flat and exposed in a direction opposite to the battery cell 10. For example, one or more circuit elements may be mounted on the outer surface S12 of the first circuit board S1, and the first pressing surface SP1 may be a flat portion of the outer surface S12 of the first circuit board S1 on which the circuit elements are not mounted, that is, a flat portion of the outer surface S12 of the first circuit board S1 which is exposed from the circuit elements. In other words, the first pressing surface SP1 may be surrounded by the first mounting portion CM1 including at least one circuit element mounted on the outer surface S12 of the first circuit board S1, and, in this case, the first pressing surface SP1 may be formed in the center area CA1 on the outer surface S12 of the first circuit board S1 which is surrounded by the first mounting portion CM1 formed in the peripheral area PA1 of the outer surface S12 of the first circuit board S1. Here, the expression that the first pressing surface SP1 is surrounded by the first mounting portion CM1 on the outer surface S12 of the first circuit board S1 is not limited to a structure in which the first mounting portion CM1 is provided entirely along the circumference of the first pressing surface SP1, but may include a structure in which the first mounting portion CM1 is provided partially along the perimeter of the first pressing surface SP1. That is, in an embodiment, the first mounting portion CM1 may entirely surround the circumference of the first pressing surface SP1, and, in another embodiment, the first mounting portion CM1 may partially surround the circumference of the first pressing surface SP1. For example, the first mounting portion CM1 may at least partially surround the circumference of the first pressing surface SP1.

In an embodiment, the first mounting portion CM1 may collectively refer to one or more circuit elements mounted on the outer surface S12 of the first circuit board S1, and, for example, the one or more circuit elements or the first mounting portion CM1 may be arranged around the first pressing surface SP1 such that the perimeter of the first pressing surface SP1 may be entirely or partially surrounded by the one or more circuit elements or the first mounting portion CM1.

The first pressing surface SP1 may refer to the center area CA1 of the outer surface S12 of the first circuit board S1 which is flat and exposed from the one or more circuit elements or from which the one or more circuit elements are excluded because the one or more circuit elements are arranged in the peripheral area PA1 of the outer surface S12 of the first circuit board S1 but are not arranged in the center area CA1 of the outer surface S12 of the first circuit board S1. In addition, the one or more circuit elements surrounding the first pressing surface SP1 formed in the center area CA1 of the outer surface S12 of the first circuit board S1 may form the first mounting portion CM1. For example, the first pressing surface SP1 may refer to the center area CA1 of the outer surface S12 of the first circuit board S1 which is flat and exposed from the circuit elements, and the first mounting portion CM1 may refer to one or more circuit elements surrounding the center area CA1 of the outer surface S12 of the first circuit board S1 in which the first pressing surface SP1 is formed. As described above, the first pressing surface SP1 may refer to the center area CA1 of the outer surface S12 of the first circuit board S1 which is flat and exposed from the circuit elements, and the first circuit board S1 may be pressed against the battery cell 10 using the first pressing surface SP1 formed in the center area CA1 of the outer surface S12 of the first circuit board S1 such that the first compressible conductor C1 provided at a position corresponding to the first pressing surface SP1 may be conductively coupled to the first electrode 10a of the battery cell 10. That is, the first compressible conductor C1 and the first pressing surface SP1 may be provided in the center areas CA1 of the inner and outer surfaces S11 and S12 of the first circuit board S1 which are corresponding center areas, and the first compressible conductor C1 arranged between the first circuit board S1 and the battery cell 10 may be compressed by pressing the center areas CA1 of the first circuit board S1. In an embodiment, the first circuit board S1 may be pressed against the battery cell 10 by applying a pressure (e.g., a preset pressure) to the first pressing surface SP1 by using a pressing device (not shown), such as a press machine, for compressing the first compressible conductor C1 formed in the center area CA1 of the inner surface S11 of the first circuit board S1 which corresponds to the first pressing surface SP1, thereby conductively coupling the first circuit board S1 and the first electrode 10a of the battery cell 10 to each other. In this case, since a pressure (e.g., a preset pressure) is applied to the first pressing surface SP1 formed in the center area CA1 of the outer surface S12 of the first circuit board S1 which is flat and exposed from the circuit elements, the first compressible conductor C1 provided at a position corresponding to the first pressing surface SP1 may be uniformly or substantially uniformly compressed without positional deviation. In addition, since the circuit elements are excluded from the first pressing surface SP1 to which a pressure (e.g., a preset pressure) is applied, the circuit elements may not be damaged by the pressure (e.g., a preset pressure) applied to the first pressing surface SP1, and since the first pressing surface SP1 is a flat surface from which the circuit elements are excluded, the first pressing surface SP1 may make stable surface contact with the pressing device (not shown), such as a press machine, when the pressing device applies a pressure (e.g., a preset pressure) to the first pressing surface SP1.

In an embodiment, the first pressing surface SP1 of the outer surface S12 of the first circuit board S1 which is flat and exposed from the circuit elements may be pressed toward the first electrode 10a of the battery cell 10 to compress the first compressible conductor C1 which is provided on a side opposite the first pressing surface SP1, and, thus, the anisotropic conductive adhesive of the first compressible conductor C1 may be compressed such that conductive particles (not shown) dispersed in an insulating base material (not shown) of the anisotropic conductive adhesive may be connected to each other to electrically connect the first circuit board S1 to the first electrode 10a of the battery cell 10.

The first insulating adhesive layer A1 and the first mounting portion CM1 may be provided at corresponding positions in the peripheral areas PA1 of the inner and outer surfaces S11 and S12 of the first circuit board S1. Here, the expression that the first insulating adhesive layer A1 and the first mounting portion CM1 are provided at corresponding positions is not limited to a structure in which the first insulating adhesive layer A1 and the first mounting portion CM1 are provided at entirely overlapping positions in the inner and outer surfaces S11 and S12 of the first circuit board S1. For example, the first insulating adhesive layer A1 insulatively couples the first circuit board S1 and the battery cell 10 to each other, and, in an embodiment, may be provided entirely along the perimeter of the first compressible conductor C1 in an inner area of the inner surface S11 of the first circuit board S1. Unlike the first insulating adhesive layer A1, in an embodiment, the first mounting portion CM1 may be provided entirely along the perimeter of the first pressing surface SP1 of the outer surface S12 of the first circuit board S1 or may be provided partially along the perimeter of the first pressing surface SP1. Thus, in the present specification, the expression that the first insulating adhesive layer A1 and the first mounting portion CM1 are provided at corresponding positions may mean that the first insulating adhesive layer A1 and the first mounting portion CM1 at least partially overlap each other along the peripheral areas PA1 of the first circuit board S1.

In an embodiment, at a time when the peripheral area PA1 of the inner surface S11 of the first circuit board S1 is insulatively coupled to the battery cell 10 with the first insulating adhesive layer A1 therebetween, the center area CA1 of the inner surface S11 of the first circuit board S1 may be conductively coupled to the battery cell 10 with the first compressible conductor C1 therebetween. For example, in an embodiment, a pressure (e.g., a preset pressure) may be applied to the first pressing surface SP1 formed in the center area CA1 of the outer surface S12 of the first circuit board S1 to compress the first compressible conductor C1 provided at a position corresponding to the first pressing surface SP1, such that the first circuit board S1 may be conductively coupled to the battery cell 10, and, at this time, the first insulating adhesive layer A1 provided in the peripheral area PA1 of the first circuit board S1 may be compressed by the pressure applied to the first pressing surface SP1 such that the first circuit board S1 may also be insulatively coupled to the battery cell 10. That is, the center area CA1 of the inner surface S11 of the first circuit board S1 may be conductively coupled to the battery cell 10 with the first compressible conductor C1 therebetween, and, at the same time, the peripheral area PA1 of the inner surface S11 of the first circuit board S1 may be insulatively coupled to the battery cell 10 with the first insulating adhesive layer A1 therebetween. In other words, the first compressible conductor C1 and the first insulating adhesive layer A1, which are arranged between the first circuit board S1 and the battery cell 10, may respectively form conductive coupling and insulative coupling between the first circuit board S1 and the battery cell 10.

As the first compressible conductor C1 and the first insulating adhesive layer A1 are compressed between the first circuit board S1 and the battery cell 10, the total height of the battery pack may decrease, and, thus, the battery pack may have a slim shape in the height direction thereof. In an embodiment, an anisotropic conductive adhesive, which is markedly reduced in height when compressed, may be used as the first compressible conductor C1, and, thus, the battery pack may have a relatively slim shape in the height direction thereof compared to a case in which a contact-type elastic part, such as a contact spring, is used in the battery pack.

The first insulating adhesive layer A1 may be formed in the peripheral area PA1 of the inner surface S11 of the first circuit board S1, and, in an embodiment, the first insulating adhesive layer A1 may be formed along the peripheral area PA1 of the inner surface S11 of the first circuit board S1 to entirely surround the first compressible conductor C1 formed at the center area CA1 of the inner surface S11 of the first circuit board S1, such that a wide coupling area may be provided between the first circuit board S1 and the battery cell 10 for secure coupling therebetween, and the first compressible conductor C1 may be sealed and protected from a surrounding environment.

The first circuit board S1 is arranged on the first surface 11 of the battery cell 10, and the second circuit board S2 is arranged on the second surface 12 of the battery cell 10 for connection with the second electrode 10b formed on the second surface 12.

A second compressible conductor C2 may be arranged between the second circuit board S2 and the second electrode 10b of the battery cell 10 as a medium for conductive connection between the second circuit board S2 and the second electrode 10b. For example, in an embodiment, the second compressible conductor C2 may include an anisotropic conductive adhesive, such as ACF. When the second electrode 10b and the second circuit board S2 are pressed in mutually-facing directions, the anisotropic configuration adhesive provided as the second compressible conductor C2 may be compressed between the second electrode 10b and the second circuit board S2, and, thus, conductive particles (not shown) dispersed in an insulating base material (not shown) of the anisotropic conductive adhesive may be connected to each other such that the anisotropic conductive adhesive may have conductivity for electrically connecting the second electrode 10b and the second circuit board S2 to each other.

The second compressible conductor C2 may be provided on the inner surface S21 of the second circuit board S2 which faces the second electrode 10b. Together with the second compressible conductor C2, a second insulating adhesive layer A2 may be arranged on the inner surface S21 of the second circuit board S2 to surround the second compressible conductor C2. In an embodiment, the second compressible conductor C2 may be provided at a center area CA2 of the inner surface S21 of the second circuit board S2, and the second insulating adhesive layer A2 may be provided in a peripheral area PA2 surrounding the center area CA2 of the inner surface S21 of the second circuit board S2. The second insulating adhesive layer A2 may be arranged between the second circuit board S2 and the battery cell 10 (or the second electrode 10b of the battery cell 10) and may insulatively couple the second circuit board S2 and the battery cell 10 to each other. Here, the inner surface S21 of the second circuit board S2 may refer to a surface of the second circuit board S2 which faces the second surface 12 of the battery cell 10 or the second electrode 10b of the battery cell 10, and the outer surface S22 of the second circuit board S2 may refer to another surface of the second circuit board S2 which is opposite the second surface 12 of the battery cell 10 or the second electrode 10b of the battery cell 10.

In an embodiment, a second electrode pad E2 may be provided at the center area CA2 of the inner surface S21 of the second circuit board S2 for electrical connection with the second electrode 10b of the battery cell 10, and a conductive pattern (not shown) may be provided in the peripheral area PA2 of the inner surface S21 of the second circuit board S2 for transmission of charge-discharge current or different electrical signals. In this case, the center area CA2 of the inner surface S21 of the second circuit board S2 may refer to a position at which the second electrode pad E2 for electrical connection with the second electrode 10b of the battery cell 10 or the second compressible conductor C2 electrically connected to the second electrode pad E2 is provided on the inner surface S21 of the second circuit board S2, and the peripheral area PA2 of the inner surface S21 of the second circuit board S2 may refer to a position surrounding the second electrode pad E2 formed in the center area CA2 of the inner surface 21 of the second circuit board S2 or the second compressible conductor C2 electrically connected to the second electrode pad E2. However, in another embodiment, the center area CA2 and the peripheral area PA2 of the inner surface S21 of the second circuit board S2 may respectively refer to a center position including the center of the second circuit board S2 having an approximately circular shape and a peripheral position around the center position, independently of the second electrode pad E2 formed on the second circuit board S2 or the second compressible conductor C2 electrically connected to the second electrode pad E2. As described later, in the center area CA2 of the inner surface S21 of the second circuit board S2, the second surface 12 (or the second electrode 10b) of the battery cell 10 and the second circuit board S2 (for example, the second electrode pad E2 of the second circuit board S2) may be conductively coupled to each other with the second compressible conductor C2 therebetween, and in the peripheral area PA2 of the inner surface S21 of the second circuit board S2, the second surface 12 (or the second electrode 10b) of the battery cell 10 and the second circuit board S2 (for example, the conductive pattern of the second circuit board S2) may be insulatively coupled to each other with the second insulating adhesive layer A2 therebetween.

As described above, the center area CA2 and the peripheral area PA2 may be formed on the inner surface S21 of the second circuit board S2, and, similarly, a center area CA2 and a peripheral area PA2 may be formed on the outer surface S22 of the second circuit board S2. In this case, the center areas CA2 formed on the inner and outer surfaces S21 and S22 of the second circuit board S2 may be at positions corresponding to each other, and, similarly, the peripheral areas PA2 formed on the inner and outer surfaces S21 and S22 of the second circuit board S2 may be at positions corresponding to each other. In the drawings, for ease of understanding, the center areas CA2 and the peripheral areas PA2 formed on the inner and outer surfaces S21 and S22 of the second circuit board S2 are denoted with the same reference numerals.

In an embodiment, the center area CA2 of the outer surface S22 of the second circuit board S2 may refer to a position on the outer surface S22 of the second circuit board S2 which is opposite the inner surface S21 of the second circuit board S2 on which the second electrode pad E2 for electrical connection with the second electrode 10b of the battery cell 10 is provided or the second compressible conductor C2 electrically connected to the second electrode pad E2 is provided. In addition, the peripheral area PA2 of the outer surface S22 of the second circuit board S2 may refer to a position on the outer surface S22 of the second circuit board S2 which is opposite the inner surface S21 of the second circuit board S2 surrounding the second electrode pad E2 or the second compressible conductor C2 electrically connected to the second electrode pad E2. However, in another embodiment, the center area CA2 and the peripheral area PA2 of the outer surface S22 of the second circuit board S2 may respectively refer to a center position including the center of the second circuit board S2 having an approximately circular shape and a peripheral position around the center position, independently of the second electrode pad E2 formed on the second circuit board S2 or the second compressible conductor C2 electrically connected to the second electrode pad E2. Even in this case, the center areas CA2 formed on the inner and outer surfaces S21 and S22 of the second circuit board S2 may be at positions corresponding to each other, and, similarly, the peripheral areas PA2 formed on the inner and outer surfaces S21 and S22 of the second circuit board S2 may be at positions corresponding to each other.

Similarly to the second compressible conductor C2 arranged between the second circuit board S2 and the battery cell 10 together with the second insulating adhesive layer A2, the second insulating adhesive layer A2 may be compressed when the second circuit board S2 and the battery cell 10 are pressed in mutually-facing directions. In this case, the second compressible conductor C2 formed at the center area CA2 of the inner surface S21 of the second circuit board S2 may be conductively coupled to the second surface 12 (or the second electrode 10b) of the battery cell 10, and the second insulating adhesive layer A2 formed in the peripheral area PA2 of the inner surface S21 of the second circuit board S2 may be insulatively coupled to the second surface 12 (or the second electrode 10b) of the battery cell 10. In an embodiment, the second insulating adhesive layer A2 may include a double-sided tape.

The second compressible conductor C2 and the second insulating adhesive layer A2 surrounding the second compressible conductor C2 may be provided on the inner surface S21 of the second circuit board S2, and a second pressing surface SP2 and a second mounting portion CM2 surrounding the second pressing surface SP2 may be provided on the outer surface S22 of the second circuit board S2. Here, the inner surface S21 and the outer surface S22 of the second circuit board S2 may respectively refer to a side of the second circuit board S2 which faces the second electrode 10b of the battery cell 10 and the other side of the second circuit board S2 which is opposite the second electrode 10b of the battery cell 10.

The inner surface S21 and the outer surface S22 of the second circuit board S2 may have structures corresponding to each other, and the second compressible conductor C2 and the second pressing surface SP2 may be provided at corresponding positions on the inner and outer surfaces S21 and S22 of the second circuit board S2, respectively. For example, the second compressible conductor C2 and the second pressing surface SP2 may be provided at the center areas CA2 of the inner and outer surfaces S21 and S22 of the second circuit board S2. In addition, the second insulating adhesive layer A2 and the second mounting portion CM2 respectively provided on the inner and outer surfaces S21 and S22 of the second circuit board S2 may be at positions corresponding to each other. For example, the second insulating adhesive layer A2 and the second mounting portion CM2 may be provided in the peripheral areas PA2 surrounding the center areas CA2 of the inner and outer surfaces S21 and S22 of the second circuit board S2.

The second pressing surface SP2 may be formed by the outer surface S22 of the second circuit board S2 which is flat and exposed in a direction opposite to the battery cell 10. For example, one or more circuit elements may be mounted on the outer surface S22 of the second circuit board S2, and the second pressing surface SP2 may be a flat portion of the outer surface S22 of the second circuit board S2 on which the circuit elements are not mounted, that is, a flat portion of the outer surface S22 of the second circuit board S2 which is exposed from the circuit elements. In other words, the second pressing surface SP2 may be surrounded by the second mounting portion CM2 including at least one circuit element mounted on the outer surface S22 of the second circuit board S2, and, in this case, the second pressing surface SP2 may be formed in the center area CA2 on the outer surface S22 of the second circuit board S2 which is surrounded by the second mounting portion CM2 formed in the peripheral area PA2 of the outer surface S22 of the second circuit board S2. Here, the expression that the second pressing surface SP2 is surrounded by the second mounting portion CM2 on the outer surface S22 of the second circuit board S2 is not limited to a structure in which the second mounting portion CM2 is provided entirely along the perimeter of the second pressing surface SP2, but may include a structure in which the second mounting portion CM2 is provided partially along the perimeter of the second pressing surface SP2. That is, in an embodiment, the second mounting portion CM2 may entirely surround the circumference of the second pressing surface SP2, and, in another embodiment, the second mounting portion CM2 may partially surround the circumference of the second pressing surface SP2.

The second pressing surface SP2 may refer to the center area CA2 of the outer surface S22 of the second circuit board S2 which is flat and exposed from the one or more circuit elements or from which the one or more circuit elements are excluded because the one or more circuit elements are arranged in the peripheral area PA2 of the outer surface S22 of the second circuit board S2 but are not arranged in the center area CA2 of the outer surface S22 of the second circuit board S2. In addition, the one or more circuit elements surrounding the second pressing surface SP2 formed in the center area CA2 of the outer surface S22 of the second circuit board S2 may form the second mounting portion CM2.

In an embodiment, the second circuit board S2 may be pressed against the battery cell 10 using the second pressing surface SP2 formed in the center area CA2 of the outer surface S22 of the second circuit board S2 such that the second compressible conductor C2 provided at a position corresponding to the second pressing surface SP2 may be conductively coupled to the second electrode 10b of the battery cell 10. For example, the second circuit board S2 may be pressed against the battery cell 10 by applying a pressure (e.g., a preset pressure) to the second pressing surface SP2 by using a pressing device (not shown), such as a press machine, for compressing the second compressible conductor C2 formed in the center area CA2 of the inner surface S21 of the second circuit board S2 which corresponds to the second pressing surface SP2, thereby conductively coupling the second circuit board S2 and the second electrode 10b of the battery cell 10 to each other. In this case, since a pressure (e.g., a preset pressure) is applied to the second pressing surface SP2 formed in the center area CA2 of the outer surface S22 of the second circuit board S2 which is flat and exposed from the circuit elements, the second compressible conductor C2 provided at a position corresponding to the second pressing surface SP2 may be uniformly or substantially uniformly compressed without positional deviation. In addition, since the circuit elements are excluded from the second pressing surface SP2 to which a pressure (e.g., a preset pressure) is applied, the circuit elements may not be damaged by the pressure (e.g., a preset pressure) applied to the second pressing surface SP2, and, since the second pressing surface SP2 is a flat surface from which the circuit elements are excluded, the second pressing surface SP2 may make stable surface contact with the pressing device (not shown), such as a press machine, when the pressing device applies a pressure (e.g., a preset pressure) to the second pressing surface SP2.

In an embodiment, the second pressing surface SP2 of the outer surface S22 of the second circuit board S2 which is flat and exposed from the circuit elements may be pressed toward the second electrode 10b of the battery cell 10 to compress the second compressible conductor C2 which is provided on a side opposite the second pressing surface SP2, and, thus, the anisotropic conductive adhesive of the second compressible conductor C2 may be compressed such that conductive particles (not shown) dispersed in an insulating base material (not shown) of the anisotropic conductive adhesive may be connected to each other to electrically connect the second circuit board S2 to the second electrode 10b of the battery cell 10.

The second insulating adhesive layer A2 and the second mounting portion CM2 may be provided at corresponding positions in the peripheral areas PA2 of the inner and outer surfaces S21 and S22 of the second circuit board S2. Here, the expression that the second insulating adhesive layer A2 and the second mounting portion CM2 are provided at corresponding positions is not limited to a structure in which the second insulating adhesive layer A2 and the second mounting portion CM2 are provided at entirely overlapping positions of the inner and outer surfaces S21 and S22 of the second circuit board S2. For example, the second insulating adhesive layer A2 insulatively couples the second circuit board S2 and the battery cell 10 to each other, and, in an embodiment, may be provided entirely along the perimeter of the second compressible conductor C2 in an inner area of the inner surface S21 of the second circuit board S2. In an embodiment, unlike the second insulating adhesive layer A2, the second mounting portion CM2 may be provided entirely along the perimeter of the second pressing surface SP2 of the outer surface S22 of the second circuit board S2 or may be provided partially along the perimeter of the second pressing surface SP2. Thus, in the present specification, the expression that the second insulating adhesive layer A2 and the second mounting portion CM2 are provided at corresponding positions may mean that the second insulating adhesive layer A2 and the second mounting portion CM2 at least partially overlap each other along the peripheral areas PA2 of the second circuit board S2.

In an embodiment, at the time when the peripheral area PA2 of the inner surface S21 of the second circuit board S2 is insulatively coupled to the battery cell 10 with the second insulating adhesive layer A2 therebetween, the center area CA2 of the inner surface S21 of the second circuit board S2 may be conductively coupled to the battery cell 10 with the second compressible conductor C2 therebetween. In an embodiment, a pressure (e.g., a preset pressure) may be applied to the second pressing surface SP2 formed at the center area CA2 of the outer surface S22 of the second circuit board S2 to compress the second compressible conductor C2 provided at a position corresponding to the second pressing surface SP2 such that the second circuit board S2 may be conductively coupled to the battery cell 10, and, at this time, the second insulating adhesive layer A2 provided in the peripheral area PA2 of the second circuit board S2 may be compressed by the pressure (e.g., a preset pressure) applied to the second pressing surface SP2 such that the second circuit board S2 may also be insulatively coupled to the battery cell 10. In this case, the second compressible conductor C2 and the second insulating adhesive layer A2, which are arranged between the second circuit board S2 and the battery cell 10, may respectively form conductive coupling and insulative coupling between the second circuit board S2 and the battery cell 10.

As the second compressible conductor C2 and the second insulating adhesive layer A2 are compressed between the second circuit board S2 and the battery cell 10, the total height of the battery pack may be decreased, and, thus, the battery pack may have a slim shape in the height direction thereof. In an embodiment, an anisotropic conductive adhesive, which is markedly reduced in height when compressed, may be used as the second compressible conductor C2, and, thus, the battery pack may have a relatively slim shape in the height direction thereof compared to a case in which a contact-type elastic part, such as a contact spring, is used in the battery pack.

The second insulating adhesive layer A2 may be formed in the peripheral area PA2 of the inner surface S21 of the second circuit board S2, and, in an embodiment, the second insulating adhesive layer A2 may be formed along the peripheral area PA2 of the inner surface S21 of the second circuit board S2 to entirely surround the second compressible conductor C2 formed in the center area CA2 of the inner surface S21 of the second circuit board S2, such that a wide coupling area may be provided between the second circuit board S2 and the battery cell 10 for secure coupling therebetween, and the second compressible conductor C2 may be sealed and protected from a surrounding environment.

The first and second circuit boards S1 and S2 arranged on the first and second surfaces 11 and 12 of the battery cell 10 which are opposite each other may be electrically connected to each other through the flexible wiring W. For example, the flexible wiring W may cross the lateral surface 13 of the battery cell 10 and may connect together the first and second circuit boards S1 and S2 arranged on the first and second surfaces 11 and 12 of the battery cell 10 which are opposite each other. The first and second circuit boards S1 and S2, which are electrically connected to each other through the flexible wiring W, may form a charge-discharge path of the battery cell 10 and may cooperate with each other to control charge and discharge operations of the battery cell 10.

In an embodiment, a battery management system (BMS) for controlling the charge and discharge operations of the battery cell 10 may be distributed to the first and second circuit boards S1 and S2. For example, the BMS distributed to the first and second circuit boards S1 and S2 may monitor the state of the battery cell 10 to control the charge and discharge operations of the battery cell 10 according to results of the monitoring and may perform a protective operation, such as stopping the charge or discharge operation of the battery cell 10 when an abnormal situation, such as the occurrence of overheating, overvoltage, or an overcurrent, is detected in the battery cell 10.

In an embodiment, the first circuit board S1 may function as a main circuit board on which output terminals (not shown) of the battery pack are formed, and the second circuit board S2 may function as a sub-circuit board which is used to acquire state information, such as temperature from the battery cell 10, and transmit the state information to the first circuit board S1 or is used to transmit a user manipulation signal, such as an on/off manipulation signal, to the first circuit board S1. In an embodiment, for example, a thermistor (not shown) for measuring the temperature of the battery cell 10 may be arranged on the second circuit board S2.

Electrical connection between the first and second circuit boards S1 and S2 may be made through the flexible wiring W. As shown in FIG. 1, the flexible wiring W may be connected to first sides P1 of the first and second circuit boards S1 and S2 along the edges of the first and second circuit boards S1 and S2. The flexible wiring W may connect the first and second circuit boards S1 and S2 to each other while extending from the first side P1 of the first circuit board S1 to the first side P1 of the second circuit board S2 across the lateral surface 13. Here, the first sides P1 of the first and second circuit boards S1 and S2 may be on the same side along the edges of the first and second circuit boards S1 and S2 which are respectively arranged on the first and second surfaces 11 and 12 of the battery cell 10, for example, on the same side along the circumference of the battery cell 10.

In an embodiment, an additional structure for electrically or structurally connecting the first and second circuit boards S1 and S2 to each other may not be provided on second sides P2 which are opposite the first sides P1 along the edges of the first and second circuit boards S1 and S2.

The flexible wiring W may be connected to the first sides P1 of the first and second circuit boards S1 and S2 as a medium for electrically connecting the first and second circuit boards S1 and S2 to each other. In an embodiment, the flexible wiring W may form a circuit package electrically connected to the battery cell 10 while connecting together the first and second circuit boards S1 and S2 which are arranged on opposite surfaces, that is, on the first and second surfaces 11 and 12 of the battery cell 10.

Throughout the present specification, the expression that the flexible wiring W is connected to the first and second circuit boards S1 and S2 may mean that the flexible wiring W is connected to the first and second circuit boards S1 through separate connection structures, or may mean that the flexible wiring W is connected to the first and second circuit boards S1 and S2 as part of the first and second circuit boards S1 and S2. For example, the flexible wiring W may be connected to the first and second circuit boards S1 and S2 through connection pads (not shown) formed on the first and second circuit boards S1 and S2, or may be connected to the first and second circuit boards S1 and S2 as part of a flexible circuit board which overlaps the first and second circuit boards S1 and S2 and protrudes from the first and second circuit boards S1 and S2.

Figure 5A:
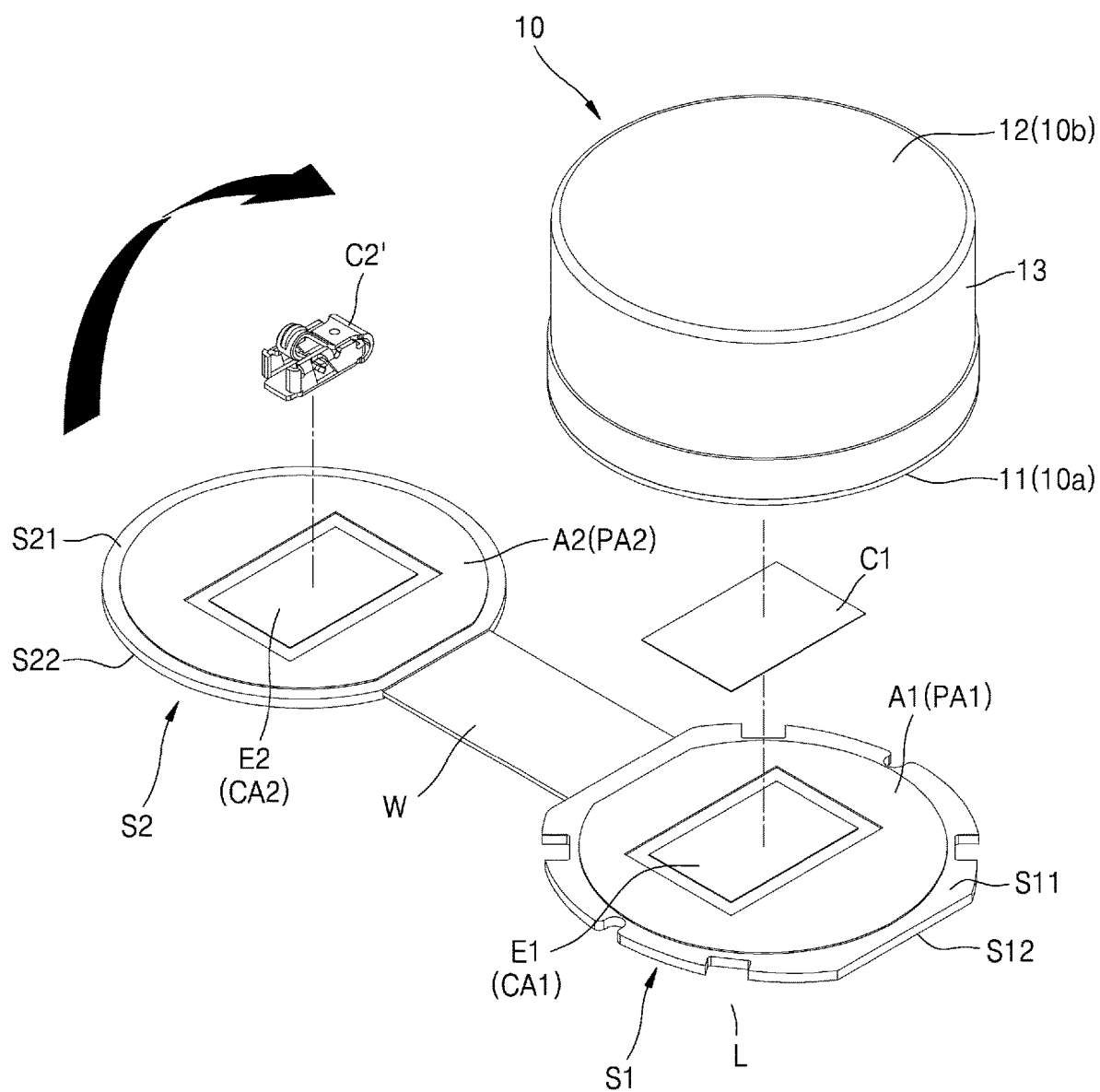
FIG. 5A is an exploded perspective view illustrating a battery pack according to another embodiment, the exploded perspective view showing inner surfaces of first and second circuit boards.
Figure 5B:
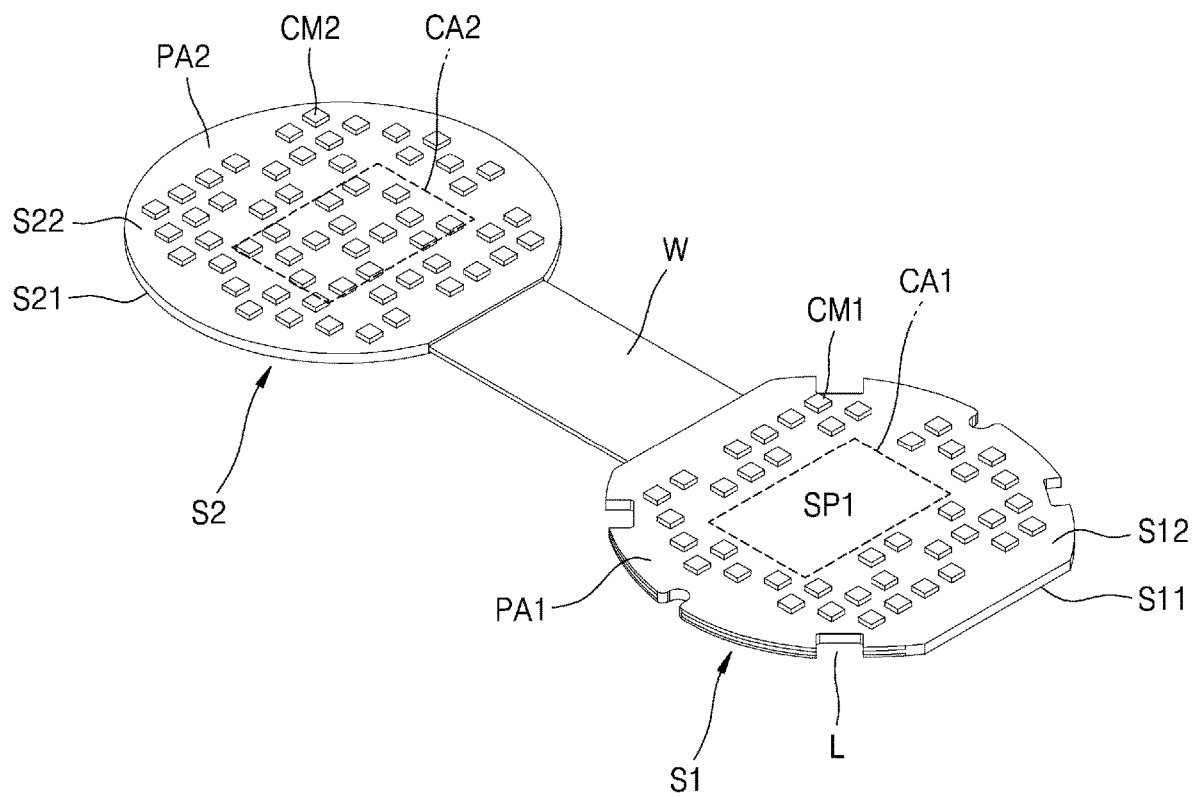
FIG. 5B is a perspective view illustrating outer surfaces of the first and second circuit boards shown in FIG. 5A.

FIG. 5A is an exploded perspective view illustrating a battery pack according to another embodiment, the exploded perspective view showing inner surfaces S11 and S21 of first and second circuit boards S1 and S2; and FIG. 5B is a perspective view illustrating outer surfaces S12 and S22 of the first and second circuit boards S1 and S2 shown in FIG. 5A.

In the embodiment shown in FIGS. 5A and 5B, an anisotropic conductive adhesive, such as an ACF, may be provided as a first compressible conductor C1 between a first electrode 10a of a battery cell 10 and the first circuit board S1, and a contact spring may be arranged as a second compressible conductor C2' between a second electrode 10b of the battery cell 10 and the second circuit board S2. That is, in the present embodiment, the first and second compressible conductors C1 and C2' arranged between the battery cell 10 and the first and second circuit boards S1 and S2 may be of different types.

For example, the first compressible conductor C1 and a first pressing surface SP1 may be respectively provided in center areas CA1 which correspond to each other and are formed on the inner and outer surfaces S11 and S12 of the first circuit board S1, and a first insulating adhesive layer A1 and a first mounting portion CM1 may be respectively provided in peripheral areas PA1 which correspond to each other and are formed on the inner and outer surfaces S11 and S12 of the first circuit board S1. When a pressure (e.g., a preset pressure) is applied to the first pressing surface SP1, the anisotropic conductive adhesive provided as the first compressible conductor C1 at a position corresponding to the first pressing surface SP1 may be compressed between the first circuit board S1 and the battery cell 10 for conductively coupling the first circuit board S1 and the battery cell 10 to each other, and the first insulating adhesive layer A1 surrounding the first compressible conductor C1 may be compressed between the first circuit board S1 and the battery cell 10 for insulatively coupling the first circuit board S1 and the battery cell 10 to each other.

The second circuit board S2 may include a second mounting portion CM2 including one or more circuit elements mounted on the outer surface S22 of the second circuit board S2. The second mounting portion CM2 may be formed at an arbitrary position on the outer surface S22 of the second circuit board S2, for example, at an arbitrary position including a center area CA2 or a peripheral area PA2 of the outer surface S22 of the second circuit board S2. In the present embodiment, since the anisotropic conductive adhesive provided as the first compressible conductor C1 is conductive when compressed, it may be required to compress the first compressible conductor C1 to impart conductivity to the first compressible conductor C1, and, thus, the first pressing surface SP1 may be provided at a position corresponding to the first compressible conductor C1. However, unlike the first compressible conductor C1, the second compressible conductor C2' provided on the second circuit board S2 is a contact-type elastic part, such as a contact spring, which has conductivity even when not compressed, and, thus, a pressing surface may not be formed at a position corresponding to the second compressible conductor C2'. For example, a contact-type elastic part, such as a contact spring, may include a metallic material and may thus have conductivity by nature.

In other words, it may not be required to form an exposed pressing surface on the outer surface S22 of the second circuit board S2 by excluding the second mounting portion CM2 from the center area CA2 of the outer surface S22 of the second circuit board S2, and, thus, the second mounting portion CM2 including at least one circuit element may be formed on the center area CA2 of the outer surface S22 of the second circuit board S2.

As described above, in an embodiment, at least one circuit element may be arranged at the center area CA2 of the outer surface S22 of the second circuit board S2 which corresponds to the second compressible conductor C2', and the second compressible conductor C2' and the second mounting portion CM2 including at least one circuit element may be provided at corresponding positions on the inner and outer surfaces S21 and S22 of the second circuit board S2. Here, the expression that the second compressible conductor C2' and the second mounting portion CM2 are formed at corresponding positions may mean that the second compressible conductor C2' and the second mounting portion CM2 may at least partially overlap each other. In an embodiment, the second compressible conductor C2' and at least one circuit element forming the second mounting portion CM2 may be formed at corresponding positions.

For example, on the inner surface S21 of the second circuit board S2, the second compressible conductor C2' may be provided at the center area CA2, and a second insulating adhesive layer A2 may surround the second compressible conductor C2'. Here, the second insulating adhesive layer A2 may be formed in a peripheral area PA2 of the inner surface S21 of the second circuit board S2 to surround the second compressible conductor C2' formed in the center area CA2 of the inner surface S21 of the second circuit board S2. In an embodiment, for example, the second insulating adhesive layer A2 may entirely surround the second compressible conductor C2'.

The second mounting portion CM2 may be formed on the outer surface S22 of the second circuit board S2. The second mounting portion CM2 may be formed at an arbitrary position on the outer surface S22 of the second circuit board S2 which includes the peripheral area PA2 corresponding to the second insulating adhesive layer A2 formed on the inner surface S21 and the center area CA2 corresponding to the second compressible conductor C2' formed on the inner surface S21. In the present embodiment, the second compressible conductor C2' provided as a contact-type elastic part, such as a contact spring, is conductive by nature and is not required to be compressed, and, thus, a pressing surface may not be formed in the center area CA2 of the outer surface S22 which corresponds to the second compressible conductor C2'.

As described above, according to one or more embodiments, the battery cell 10 having a height less than the diameter of an electrode surface is used in the battery pack together with a compressible conductor having a large height reduction when compressed for electrical connection between the battery cell 10 and a circuit board, and, thus, the battery pack may have a relatively low height and may be effectively used for slim devices.

According to one or more embodiments, due to the circuit package which includes the first and second circuit boards S1 and S2 connected to the first and second electrodes 10*a* and 10*b* and the flexible wiring W connecting the first and second circuit boards S1 and S2 to each other, the battery pack may have a simple electrical connection structure to form the charge-discharge path of the battery cell 10, and, thus, the battery pack may have a compact structure.

It is to be understood that embodiments described herein should be considered in a descriptive sense and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as set forth by the following claims.

What is claimed is:

1. A battery pack comprising:
   a battery cell comprising a first surface and a second surface which are opposite each other and on which first and second electrodes are respectively formed, and a lateral surface connecting the first and second surfaces to each other;
   a first circuit board on the first surface and connected to the first electrode;
   a second circuit board on the second surface and connected to the second electrode; and
   a flexible wiring crossing the lateral surface of the battery cell and electrically connecting the first and second circuit boards to each other,
   wherein the first circuit board comprises:
   a first compressible conductor on an inner surface of the first circuit board, the inner surface facing the first electrode;

a first pressing surface and a first mounting portion on an outer surface of the first circuit board, wherein the outer surface of the first circuit board is opposite the first electrode, and the first mounting portion surrounds at least a portion of the first pressing surface; and a first insulating adhesive layer on the inner surface of the first circuit board, surrounding the first compressible conductor, and insulatively coupling the first circuit board to the first surface of the battery cell;

wherein the first compressible conductor is adhesive and directly adhered to the first surface of the first electrode; and wherein the first insulating adhesive layer on the inner surface of the first circuit board and the first mounting portion on the outer surface of the first circuit board are at positions corresponding to each other.

2. The battery pack of claim 1, wherein the first pressing surface is at a position corresponding to the first compressible conductor.

3. A battery pack comprising:
a battery cell comprising a first surface and a second surface which are opposite each other and on which first and second electrodes are respectively formed, and a lateral surface connecting the first and second surfaces to each other;
a first circuit board on the first surface and connected to the first electrode;
a second circuit board on the second surface and connected to the second electrode; and
a flexible wiring crossing the lateral surface of the battery cell and electrically connecting the first and second circuit boards to each other,
wherein the first circuit board comprises:
a first compressible conductor on an inner surface of the first circuit board, the inner surface facing the first electrode;
a first pressing surface and a first mounting portion on an outer surface of the first circuit board, wherein the outer surface of the first circuit board is opposite the first electrode, and the first mounting portion surrounds at least a portion of the first pressing surface; and
a first insulating adhesive layer on the inner surface of the first circuit board, surrounding the first compressible conductor, and insulatively coupling the first circuit board to the first surface of the battery cell;
wherein the first circuit board is substantially circular in shape,
the first compressible conductor is at a center area of the inner surface of the first circuit board,
the first pressing surface is at a center area of the outer surface of the first circuit board,
the first mounting portion is at a peripheral area of the outer surface of the first circuit board, the peripheral area surrounding the first pressing surface of the first circuit board; and
the first insulating adhesive layer on the inner surface of the first circuit board and the first mounting portion on the outer surface of the first circuit board are at positions corresponding to each other.

4. The battery pack of claim 1, wherein the first pressing surface is defined by a flat portion of the outer surface of the first circuit board, the flat portion being exposed in a direction opposite the first electrode.

5. The battery pack of claim 1, wherein the first compressible conductor comprises an anisotropic conductive adhesive.

6. The battery pack of claim 1, wherein the first mounting portion comprises at least one circuit element mounted on the outer surface of the first circuit board.

7. The battery pack of claim 1, wherein
the first compressible conductor is at a center area of the inner surface of the first circuit board, and
the first insulating adhesive layer is at a peripheral area of the inner surface of the first circuit board, the peripheral area surrounding the center area of the inner surface of the first circuit board.

8. The battery pack of claim 1, wherein the first insulating adhesive layer comprises a double-sided tape.

9. The battery pack of claim 1, wherein the second circuit board comprises:
a second compressible conductor on an inner surface of the second circuit board, the inner surface facing the second electrode;
a second pressing surface and a second mounting portion on an outer surface of the second circuit board, wherein the outer surface of the second circuit board is opposite the second electrode and the second mounting portion surrounds at least a portion of the second pressing surface; and
wherein the second pressing surface is opposite to the first pressing surface along a longitudinal direction of the battery cell.

10. The battery pack of claim 9, wherein the second compressible conductor comprises an anisotropic conductive adhesive.

11. The battery pack of claim 10, wherein the second pressing surface is at a position corresponding to the second compressible conductor.

12. The battery pack of claim 11, wherein
the second circuit board is substantially circular in shape,
the second compressible conductor is at a center area of the inner surface of the second circuit board,
the second pressing surface is at a center area of the outer surface of the second circuit board, and
the second mounting portion is at a peripheral area of the outer surface of the second circuit board, the peripheral area surrounding the center area of the outer surface of the second circuit board.

13. The battery pack of claim 10, wherein the second pressing surface is defined by a flat portion of the outer surface of the second circuit board, the flat portion being exposed in a direction opposite the second electrode.

14. The battery pack of claim 9, wherein the second compressible conductor comprises a contact-type elastic part.

15. The battery pack of claim 14, wherein the second mounting portion comprises at least one circuit element mounted on the outer surface of the second circuit board at a position corresponding to the second compressible conductor.

16. The battery pack of claim 9, wherein a second insulating adhesive layer is arranged on the inner surface of the second circuit board and surrounds the second compressible conductor.

17. The battery pack of claim 16, wherein
the second compressible conductor is at a center area of the inner surface of the second circuit board, and
the second insulating adhesive layer is at a peripheral area of the inner surface of the second circuit board, the peripheral area surrounding the center area of the inner surface of the second circuit board.

18. The battery pack of claim 16, wherein the second insulating adhesive layer comprises a double-sided tape.

19. The battery pack of claim 3, wherein the first pressing surface is free of circuit elements.

20. The battery pack of claim 1, wherein the first insulating adhesive layer insulatively couples the first circuit board to the first surface of the battery cell along an entire perimeter of the first compressible conductor.

* * * * *